(12) United States Patent
Hoirup et al.

(10) Patent No.: US 9,231,643 B2
(45) Date of Patent: *Jan. 5, 2016

(54) METHOD AND APPARATUS FOR RADIO ANTENNA FREQUENCY TUNING

(71) Applicant: BlackBerry Limited, Waterloo (CA)

(72) Inventors: Carsten Hoirup, Crystal Lake, IL (US); Keith Manssen, Bull Valley, IL (US); Matthew Russell Greene, Crystal Lake, IL (US)

(73) Assignee: BlackBerry Limited, Waterloo, ON (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/200,222

(22) Filed: Mar. 7, 2014

(65) Prior Publication Data
US 2014/0187180 A1 Jul. 3, 2014

Related U.S. Application Data

(63) Continuation of application No. 13/030,177, filed on Feb. 18, 2011, now Pat. No. 8,712,340.

(51) Int. Cl.
*H04B 1/40* (2015.01)
*H04B 1/401* (2015.01)
(Continued)

(52) U.S. Cl.
CPC ............ *H04B 1/401* (2013.01); *H01Q 1/242* (2013.01); *H01Q 9/14* (2013.01); *H03H 7/40* (2013.01); *H04B 1/0458* (2013.01); *H04B 1/18* (2013.01)

(58) Field of Classification Search
CPC ........... H01Q 1/242; H01Q 9/14; H04B 1/18; H04B 1/401; H04B 1/0458; H03H 7/40
USPC .......... 455/67.11, 77, 78, 82, 83, 84, 87, 125, 455/234.1, 333, 120, 121, 193.1, 193.2, 455/230, 240.1, 69
See application file for complete search history.

(56) References Cited

U.S. PATENT DOCUMENTS

| 2,745,067 A | 5/1956 | True |
| 3,117,279 A | 1/1964 | Ludvigson |

(Continued)

FOREIGN PATENT DOCUMENTS

| CN | 101640949 A | 2/2010 |
| DE | 19614655 | 10/1997 |

(Continued)

OTHER PUBLICATIONS

Payandehjoo, Kasra et al., "Investigation of Parasitic Elements for Coupling Reduction in Multi Antenna Hand-Set Devices", Published online Jan. 22, 2013 in Wiley Online Library (wileyonlinelibrary.com).

(Continued)

*Primary Examiner* — Ping Hsieh
(74) *Attorney, Agent, or Firm* — Guntin & Gust, PLC; Andrew Gust

(57) ABSTRACT

A system that incorporates teachings of the present disclosure may include, for example, a non-transitory computer-readable storage medium, which can include computer instructions to determine a subset of use cases from a group of use cases stored in a memory of a communication device, and to determine a target use case from among the subset of use cases based on an operational parameter associated with a transceiver of the communication device. Additional embodiments are disclosed.

20 Claims, 7 Drawing Sheets

(51) Int. Cl.
*H01Q 1/24* (2006.01)
*H01Q 9/14* (2006.01)
*H03H 7/40* (2006.01)
*H04B 1/04* (2006.01)
*H04B 1/18* (2006.01)

(56) References Cited

U.S. PATENT DOCUMENTS

| | | |
|---|---|---|
| 3,160,832 A | 12/1964 | Beitman |
| 3,390,337 A | 6/1968 | Beitman |
| 3,443,231 A | 5/1969 | Roza |
| 3,509,500 A | 4/1970 | McNair |
| 3,571,716 A | 3/1971 | Hill |
| 3,590,385 A | 6/1971 | Sabo |
| 3,601,717 A | 8/1971 | Kuecken |
| 3,742,279 A | 6/1973 | Kupsky |
| 3,749,491 A | 7/1973 | Maxfield et al. |
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta |
| 4,227,256 A | 10/1980 | O'Keefe |
| 4,383,441 A | 5/1983 | Willis |
| 4,476,578 A | 10/1984 | Gaudin |
| 4,493,112 A | 1/1985 | Bruene |
| 4,509,019 A | 4/1985 | Banu et al. |
| 4,777,490 A | 10/1988 | Sharma |
| 4,799,066 A | 1/1989 | Deacon |
| 4,965,607 A | 10/1990 | Wilkins |
| 4,980,656 A | 12/1990 | Duffalo |
| 5,032,805 A | 7/1991 | Elmer |
| 5,136,478 A | 8/1992 | Bruder |
| 5,142,255 A | 8/1992 | Chang |
| 5,177,670 A | 1/1993 | Shinohara |
| 5,195,045 A | 3/1993 | Keane |
| 5,200,826 A | 4/1993 | Seong |
| 5,212,463 A | 5/1993 | Babbitt |
| 5,243,358 A | 9/1993 | Sanford |
| 5,258,728 A | 11/1993 | Taniyoshi |
| 5,276,912 A | 1/1994 | Siwiak |
| 5,301,358 A | 4/1994 | Gaskill |
| 5,307,033 A | 4/1994 | Koscica |
| 5,310,358 A | 5/1994 | Johnson |
| 5,312,790 A | 5/1994 | Sengupta |
| 5,334,958 A | 8/1994 | Babbitt |
| 5,361,403 A | 11/1994 | Dent |
| 5,371,473 A | 12/1994 | Trinh |
| 5,409,889 A | 4/1995 | Das |
| 5,427,988 A | 6/1995 | Sengupta |
| 5,430,417 A | 7/1995 | Martin |
| 5,446,447 A | 8/1995 | Carney |
| 5,448,252 A | 9/1995 | Ali |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A | 6/1996 | Bradley |
| 5,548,837 A | 8/1996 | Hess et al. |
| 5,561,407 A | 10/1996 | Koscica |
| 5,564,086 A | 10/1996 | Cygan |
| 5,589,844 A | 12/1996 | Belcher et al. |
| 5,593,495 A | 1/1997 | Masuda |
| 5,635,433 A | 6/1997 | Sengupta |
| 5,635,434 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,721,194 A | 2/1998 | Yandrofski |
| 5,766,697 A | 6/1998 | Sengupta |
| 5,777,581 A | 7/1998 | Lilly |
| 5,778,308 A | 7/1998 | Sroka |
| 5,786,727 A | 7/1998 | Sigmon |
| 5,812,572 A | 9/1998 | King |
| 5,812,943 A | 9/1998 | Suzuki |
| 5,830,591 A | 11/1998 | Sengupta |
| 5,846,893 A | 12/1998 | Sengupta |
| 5,874,926 A | 2/1999 | Tsuru |
| 5,880,635 A | 3/1999 | Satoh |
| 5,886,867 A | 3/1999 | Chivukula |
| 5,892,482 A | 4/1999 | Coleman et al. |
| 5,929,717 A | 7/1999 | Richardson |
| 5,940,030 A | 8/1999 | Hampel et al. |
| 5,963,871 A | 10/1999 | Zhinong |
| 5,969,582 A | 10/1999 | Boesch |
| 5,982,099 A | 11/1999 | Barnes et al. |
| 5,990,766 A | 11/1999 | Zhang |
| 6,009,124 A | 12/1999 | Smith |
| 6,020,787 A | 2/2000 | Kim |
| 6,020,795 A | 2/2000 | Kim |
| 6,029,075 A | 2/2000 | Das |
| 6,045,932 A | 4/2000 | Jia |
| 6,061,025 A | 5/2000 | Jackson |
| 6,064,865 A | 5/2000 | Kuo et al. |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand |
| 6,115,585 A | 9/2000 | Matero |
| 6,125,266 A | 9/2000 | Matero et al. |
| 6,133,883 A | 10/2000 | Munson |
| 6,172,385 B1 | 1/2001 | Duncombe |
| 6,215,644 B1 | 4/2001 | Dhuler |
| 6,242,989 B1 | 6/2001 | Barber |
| 6,281,748 B1 | 8/2001 | Klomsdorf et al. |
| 6,281,847 B1 | 8/2001 | Lee |
| 6,309,895 B1 | 10/2001 | Jaing |
| 6,343,208 B1 | 1/2002 | Ying |
| 6,377,142 B1 | 4/2002 | Chiu |
| 6,377,217 B1 | 4/2002 | Zhu |
| 6,377,440 B1 | 4/2002 | Zhu |
| 6,384,785 B1 | 5/2002 | Kamogawa |
| 6,404,614 B1 | 6/2002 | Zhu |
| 6,408,190 B1 | 6/2002 | Ying |
| 6,414,562 B1 | 7/2002 | Bouisse |
| 6,415,562 B1 | 7/2002 | Donaghue |
| 6,452,776 B1 | 9/2002 | Chakravorty |
| 6,461,930 B2 | 10/2002 | Akram |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu |
| 6,535,076 B2 | 3/2003 | Partridge |
| 6,535,722 B1 | 3/2003 | Rosen |
| 6,538,603 B1 | 3/2003 | Chen |
| 6,556,102 B1 | 4/2003 | Sengupta |
| 6,556,814 B1 | 4/2003 | Klomsdorf |
| 6,570,462 B2 | 5/2003 | Edmonson |
| 6,590,468 B2 | 7/2003 | du Toit |
| 6,590,541 B1 | 7/2003 | Schultze |
| 6,597,265 B2 | 7/2003 | Liang |
| 6,608,603 B2 | 8/2003 | Alexopoulos |
| 6,624,786 B2 | 9/2003 | Boyle |
| 6,640,085 B1 | 10/2003 | Chatzipetros |
| 6,657,595 B1 | 12/2003 | Phillips |
| 6,661,638 B2 | 12/2003 | Jackson |
| 6,670,256 B2 | 12/2003 | Yang |
| 6,710,651 B2 | 3/2004 | Forrester |
| 6,724,611 B1 | 4/2004 | Mosley |
| 6,724,890 B1 | 4/2004 | Bareis |
| 6,737,179 B2 | 5/2004 | Sengupta |
| 6,747,522 B2 | 6/2004 | Pietruszynski et al. |
| 6,759,918 B2 | 7/2004 | Du Toit |
| 6,765,540 B2 | 7/2004 | Toncich |
| 6,768,472 B2 | 7/2004 | Alexopoulos |

(56) References Cited

U.S. PATENT DOCUMENTS

| | | |
|---|---|---|
| 6,774,077 B2 | 8/2004 | Sengupta |
| 6,795,712 B1 | 9/2004 | Vakilian |
| 6,825,818 B2 | 11/2004 | Toncich |
| 6,839,028 B2 | 1/2005 | Lee |
| 6,845,126 B2 | 1/2005 | Dent |
| 6,859,104 B2 | 2/2005 | Toncich |
| 6,862,432 B1 | 3/2005 | Kim |
| 6,864,757 B2 | 3/2005 | Du Toit |
| 6,868,260 B2 | 3/2005 | Jagielski |
| 6,875,655 B2 | 4/2005 | Lin |
| 6,882,245 B2 | 4/2005 | Utsunomiya |
| 6,888,714 B2 | 5/2005 | Shaw |
| 6,905,989 B2 | 6/2005 | Ellis |
| 6,906,653 B2 | 6/2005 | Uno |
| 6,907,234 B2 | 6/2005 | Karr |
| 6,920,315 B1 | 7/2005 | Wilcox et al. |
| 6,922,330 B2 | 7/2005 | Nielsen |
| 6,943,078 B1 | 9/2005 | Zheng |
| 6,946,847 B2 | 9/2005 | Nishimori |
| 6,949,442 B2 | 9/2005 | Barth |
| 6,961,368 B2 | 11/2005 | Dent |
| 6,964,296 B2 | 11/2005 | Memory |
| 6,965,837 B2 | 11/2005 | Vintola |
| 6,987,493 B2 | 1/2006 | Chen |
| 6,993,297 B2 | 1/2006 | Smith |
| 6,999,297 B1 | 2/2006 | Klee |
| 7,009,455 B2 | 3/2006 | Toncich |
| 7,071,776 B2 | 7/2006 | Forrester |
| 7,106,715 B1 | 9/2006 | Kelton |
| 7,107,033 B2 | 9/2006 | D du Toit |
| 7,113,614 B2 | 9/2006 | Rhoads |
| 7,151,411 B2 | 12/2006 | Martin |
| 7,176,634 B2 | 2/2007 | Kitamura |
| 7,176,845 B2 | 2/2007 | Fabrega-Sanchez |
| 7,180,467 B2 | 2/2007 | Fabrega-Sanchez |
| 7,221,327 B2 | 5/2007 | Toncich |
| 7,298,329 B2 | 11/2007 | Diament |
| 7,299,018 B2 | 11/2007 | Van Rumpt |
| 7,312,118 B2 | 12/2007 | Kiyotoshi |
| 7,332,980 B2 | 2/2008 | Zhu |
| 7,332,981 B2 | 2/2008 | Matsuno |
| 7,339,527 B2 | 3/2008 | Sager |
| 7,369,828 B2 | 5/2008 | Shamsaifar |
| 7,426,373 B2 | 9/2008 | Clingman |
| 7,427,949 B2 | 9/2008 | Channabasappa et al. |
| 7,453,405 B2 | 11/2008 | Nishikido et al. |
| 7,468,638 B1 | 12/2008 | Tsai |
| 7,469,129 B2 | 12/2008 | Blaker et al. |
| 7,531,011 B2 | 5/2009 | Yamasaki |
| 7,535,080 B2 | 5/2009 | Zeng et al. |
| 7,535,312 B2 | 5/2009 | McKinzie |
| 7,539,527 B2 | 5/2009 | Jang |
| 7,557,507 B2 | 7/2009 | Wu |
| 7,596,357 B2 | 9/2009 | Nakamata |
| 7,633,355 B2 | 12/2009 | Matsuo |
| 7,642,879 B2 | 1/2010 | Matsuno |
| 7,655,530 B2 | 2/2010 | Hosking |
| 7,667,663 B2 | 2/2010 | Hsiao |
| 7,671,693 B2 | 3/2010 | Brobston et al. |
| 7,705,692 B2 | 4/2010 | Fukamachi et al. |
| 7,711,337 B2 | 5/2010 | McKinzie |
| 7,714,676 B2 | 5/2010 | McKinzie |
| 7,714,678 B2 | 5/2010 | du Toit et al. |
| 7,728,693 B2 | 6/2010 | du Toit et al. |
| 7,760,699 B1 | 7/2010 | Malik |
| 7,768,400 B2 | 8/2010 | Lawrence et al. |
| 7,786,819 B2 | 8/2010 | Ella |
| 7,795,990 B2 | 9/2010 | du Toit |
| 7,852,170 B2 | 12/2010 | McKinzie |
| 7,856,228 B2 | 12/2010 | Lekutai et al. |
| 7,865,154 B2 | 1/2011 | Mendolia |
| 7,907,094 B2 | 3/2011 | Kakitsu et al. |
| 7,917,104 B2 | 3/2011 | Manssen et al. |
| 7,949,309 B2 | 5/2011 | Rofougaran |
| 7,969,257 B2 | 6/2011 | du Toit |
| 7,983,615 B2 | 7/2011 | Bryce et al. |
| 7,991,363 B2 | 8/2011 | Greene |
| 8,008,982 B2 | 8/2011 | McKinzie |
| 8,072,285 B2 | 12/2011 | Spears |
| 8,112,043 B2 | 2/2012 | Knudsen et al. |
| 8,170,510 B2 | 5/2012 | Knudsen et al. |
| 8,190,109 B2 | 5/2012 | Ali et al. |
| 8,204,446 B2 | 6/2012 | Scheer |
| 8,217,731 B2 | 7/2012 | McKinzie et al. |
| 8,217,732 B2 | 7/2012 | McKinzie |
| 8,299,867 B2 * | 10/2012 | McKinzie, III ............... 333/17.3 |
| 8,320,850 B1 | 11/2012 | Khlat |
| 8,325,097 B2 | 12/2012 | McKinzie, III et al. |
| 8,405,563 B2 | 3/2013 | McKinzie et al. |
| 8,421,548 B2 | 4/2013 | Spears et al. |
| 8,432,234 B2 | 4/2013 | Manssen et al. |
| 8,442,457 B2 | 5/2013 | Harel et al. |
| 8,457,569 B2 | 6/2013 | Blin |
| 8,472,888 B2 | 6/2013 | Manssen et al. |
| 8,558,633 B2 | 10/2013 | McKinzie, III |
| 8,564,381 B2 | 10/2013 | McKinzie |
| 8,594,584 B2 | 11/2013 | Greene et al. |
| 8,620,236 B2 | 12/2013 | Manssen et al. |
| 8,620,246 B2 | 12/2013 | McKinzie et al. |
| 8,620,247 B2 | 12/2013 | McKinzie et al. |
| 8,655,286 B2 | 2/2014 | Mendolia |
| 8,674,783 B2 | 3/2014 | Spears et al. |
| 8,680,934 B2 | 3/2014 | McKinzie et al. |
| 8,693,963 B2 | 4/2014 | du Toit et al. |
| 8,712,340 B2 * | 4/2014 | Hoirup et al. .................. 455/77 |
| 8,787,845 B2 | 7/2014 | Manssen et al. |
| 2002/0008672 A1 | 1/2002 | Gothard |
| 2002/0030566 A1 | 3/2002 | Bozler |
| 2002/0079982 A1 | 6/2002 | Lafleur et al. |
| 2002/0109642 A1 | 8/2002 | Gee et al. |
| 2002/0118075 A1 | 8/2002 | Ohwada |
| 2002/0145483 A1 | 10/2002 | Bouisse |
| 2002/0167963 A1 | 11/2002 | Joa-Ng |
| 2002/0183013 A1 | 12/2002 | Auckland et al. |
| 2002/0187780 A1 | 12/2002 | Souissi |
| 2002/0191703 A1 | 12/2002 | Ling |
| 2002/0193088 A1 | 12/2002 | Jung |
| 2003/0060227 A1 | 3/2003 | Sekine |
| 2003/0071300 A1 | 4/2003 | Yashima |
| 2003/0114124 A1 | 6/2003 | Higuchi |
| 2003/0142022 A1 | 7/2003 | Ollikainen |
| 2003/0193997 A1 | 10/2003 | Dent |
| 2003/0199286 A1 | 10/2003 | D du Toit |
| 2003/0210206 A1 | 11/2003 | Phillips |
| 2003/0216150 A1 | 11/2003 | Ueda |
| 2003/0232607 A1 | 12/2003 | Le Bars |
| 2004/0009754 A1 | 1/2004 | Smith |
| 2004/0090372 A1 | 5/2004 | Nallo |
| 2004/0100341 A1 | 5/2004 | Luetzelschwab |
| 2004/0127178 A1 | 7/2004 | Kuffner |
| 2004/0137950 A1 | 7/2004 | Bolin |
| 2004/0202399 A1 | 10/2004 | Kochergin |
| 2004/0227176 A1 | 11/2004 | York |
| 2004/0232982 A1 | 11/2004 | Ichitsubo et al. |
| 2004/0257293 A1 | 12/2004 | Friedrich |
| 2004/0263411 A1 | 12/2004 | Fabrega-Sanchez et al. |
| 2005/0007291 A1 | 1/2005 | Fabrega-Sanchez |
| 2005/0032488 A1 | 2/2005 | Pehlke |
| 2005/0032541 A1 | 2/2005 | Wang |
| 2005/0042994 A1 | 2/2005 | Otaka |
| 2005/0059362 A1 | 3/2005 | Kalajo |
| 2005/0082636 A1 | 4/2005 | Yashima |
| 2005/0085204 A1 | 4/2005 | Poilasne et al. |
| 2005/0093624 A1 | 5/2005 | Forrester et al. |
| 2005/0130608 A1 | 6/2005 | Forse |
| 2005/0130699 A1 | 6/2005 | Kim |
| 2005/0208960 A1 | 9/2005 | Hassan |
| 2005/0215204 A1 | 9/2005 | Wallace |
| 2005/0227633 A1 | 10/2005 | Dunko |
| 2005/0259011 A1 | 11/2005 | Vance |
| 2005/0264455 A1 | 12/2005 | Talvitie |
| 2005/0282503 A1 | 12/2005 | Onno |
| 2006/0003537 A1 | 1/2006 | Sinha |
| 2006/0009165 A1 | 1/2006 | Alles |

(56) References Cited

U.S. PATENT DOCUMENTS

| | | |
|---|---|---|
| 2006/0077082 A1 | 4/2006 | Shanks et al. |
| 2006/0099915 A1* | 5/2006 | Laroia et al. ............... 455/101 |
| 2006/0119511 A1 | 6/2006 | Collinson |
| 2006/0148415 A1* | 7/2006 | Hamalainen et al. ........... 455/69 |
| 2006/0160501 A1 | 7/2006 | Mendolia |
| 2006/0183431 A1 | 8/2006 | Chang et al. |
| 2006/0183433 A1 | 8/2006 | Mori et al. |
| 2006/0183442 A1 | 8/2006 | Chang et al. |
| 2006/0195161 A1 | 8/2006 | Li et al. |
| 2006/0205368 A1 | 9/2006 | Bustamante |
| 2006/0281423 A1 | 12/2006 | Caimi |
| 2007/0013483 A1 | 1/2007 | Stewart |
| 2007/0035458 A1 | 2/2007 | Ohba |
| 2007/0042725 A1 | 2/2007 | Poilasne |
| 2007/0042734 A1 | 2/2007 | Ryu |
| 2007/0063788 A1 | 3/2007 | Zhu |
| 2007/0080888 A1 | 4/2007 | Mohamadi |
| 2007/0082611 A1 | 4/2007 | Terranova et al. |
| 2007/0085609 A1 | 4/2007 | Itkin |
| 2007/0091006 A1 | 4/2007 | Thober et al. |
| 2007/0111681 A1 | 5/2007 | Alberth et al. |
| 2007/0142011 A1 | 6/2007 | Shatara |
| 2007/0142014 A1 | 6/2007 | Wilcox |
| 2007/0149146 A1 | 6/2007 | Hwang |
| 2007/0171879 A1 | 7/2007 | Bourque |
| 2007/0182636 A1 | 8/2007 | Carlson |
| 2007/0184825 A1 | 8/2007 | Lim et al. |
| 2007/0194859 A1 | 8/2007 | Brobston |
| 2007/0197180 A1 | 8/2007 | McKinzie et al. |
| 2007/0200766 A1 | 8/2007 | McKinzie |
| 2007/0200773 A1 | 8/2007 | Dou et al. |
| 2007/0248238 A1 | 10/2007 | Abreu et al. |
| 2007/0285326 A1 | 12/2007 | McKinzie |
| 2007/0293176 A1 | 12/2007 | Yu |
| 2008/0007478 A1 | 1/2008 | Jung |
| 2008/0018541 A1 | 1/2008 | Pang |
| 2008/0055016 A1 | 3/2008 | Morris |
| 2008/0081670 A1 | 4/2008 | Rofougaran |
| 2008/0090539 A1 | 4/2008 | Thompson |
| 2008/0094149 A1 | 4/2008 | Brobston |
| 2008/0106350 A1 | 5/2008 | McKinzie |
| 2008/0122553 A1 | 5/2008 | McKinzie |
| 2008/0122723 A1 | 5/2008 | Rofougaran |
| 2008/0129612 A1 | 6/2008 | Wang |
| 2008/0158076 A1 | 7/2008 | Walley |
| 2008/0261544 A1 | 10/2008 | Blin |
| 2008/0274706 A1 | 11/2008 | Blin |
| 2008/0280570 A1 | 11/2008 | Blin |
| 2008/0285729 A1 | 11/2008 | Glasgow et al. |
| 2008/0294718 A1 | 11/2008 | Okano |
| 2008/0300027 A1 | 12/2008 | Dou |
| 2008/0305749 A1 | 12/2008 | Ben-Bassat |
| 2008/0305750 A1 | 12/2008 | Alon et al. |
| 2008/0309617 A1 | 12/2008 | Kong et al. |
| 2009/0002077 A1 | 1/2009 | Rohani et al. |
| 2009/0027286 A1 | 1/2009 | Ohishi |
| 2009/0039976 A1 | 2/2009 | McKinzie, III |
| 2009/0082017 A1 | 3/2009 | Chang et al. |
| 2009/0109880 A1 | 4/2009 | Kim et al. |
| 2009/0121963 A1 | 5/2009 | Greene |
| 2009/0149136 A1 | 6/2009 | Rofougaran |
| 2009/0180403 A1 | 7/2009 | Tudosoiu |
| 2009/0184879 A1 | 7/2009 | Derneryd |
| 2009/0215446 A1 | 8/2009 | Hapsari et al. |
| 2009/0231220 A1 | 9/2009 | Zhang et al. |
| 2009/0253385 A1 | 10/2009 | Dent et al. |
| 2009/0264065 A1 | 10/2009 | Song |
| 2009/0278685 A1 | 11/2009 | Potyrailo |
| 2009/0295651 A1 | 12/2009 | Dou et al. |
| 2009/0323572 A1 | 12/2009 | Shi et al. |
| 2009/0323582 A1 | 12/2009 | Proctor et al. |
| 2010/0041348 A1 | 2/2010 | Wilcox et al. |
| 2010/0053009 A1 | 3/2010 | Rofougaran |
| 2010/0060531 A1 | 3/2010 | Rappaport |
| 2010/0073103 A1 | 3/2010 | Spears et al. |
| 2010/0085260 A1 | 4/2010 | McKinzie |
| 2010/0085884 A1 | 4/2010 | Srinivasan et al. |
| 2010/0105425 A1 | 4/2010 | Asokan |
| 2010/0156552 A1 | 6/2010 | McKinzie |
| 2010/0164640 A1 | 7/2010 | McKinzie |
| 2010/0164641 A1 | 7/2010 | McKinzie |
| 2010/0232474 A1* | 9/2010 | Rofougaran et al. ......... 375/135 |
| 2010/0244576 A1 | 9/2010 | Hillan et al. |
| 2010/0285836 A1 | 11/2010 | Horihata et al. |
| 2010/0302106 A1 | 12/2010 | Knudsen et al. |
| 2010/0304688 A1 | 12/2010 | Knudsen |
| 2011/0002080 A1 | 1/2011 | Ranta |
| 2011/0012790 A1 | 1/2011 | Badaruzzaman |
| 2011/0014879 A1 | 1/2011 | Alberth et al. |
| 2011/0014886 A1 | 1/2011 | Manssen |
| 2011/0043298 A1 | 2/2011 | McKinzie |
| 2011/0043328 A1 | 2/2011 | Bassali |
| 2011/0053524 A1 | 3/2011 | Manssen |
| 2011/0063042 A1 | 3/2011 | Mendolia |
| 2011/0086600 A1 | 4/2011 | Muhammad |
| 2011/0086630 A1 | 4/2011 | Manssen |
| 2011/0102290 A1 | 5/2011 | Milosavljevic |
| 2011/0105023 A1* | 5/2011 | Scheer et al. ................ 455/41.2 |
| 2011/0116423 A1 | 5/2011 | Rousu et al. |
| 2011/0117863 A1 | 5/2011 | Camp, Jr. et al. |
| 2011/0117973 A1 | 5/2011 | Asrani et al. |
| 2011/0121079 A1 | 5/2011 | Lawrence et al. |
| 2011/0133994 A1 | 6/2011 | Korva |
| 2011/0140982 A1 | 6/2011 | Ozden et al. |
| 2011/0183628 A1 | 7/2011 | Baker |
| 2011/0183633 A1 | 7/2011 | Ohba |
| 2011/0195679 A1 | 8/2011 | Lee et al. |
| 2011/0227666 A1 | 9/2011 | Manssen |
| 2011/0237207 A1 | 9/2011 | Bauder |
| 2011/0249760 A1 | 10/2011 | Chrisikos et al. |
| 2011/0250852 A1 | 10/2011 | Greene |
| 2011/0254637 A1 | 10/2011 | Manssen |
| 2011/0254638 A1 | 10/2011 | Manssen |
| 2011/0256857 A1 | 10/2011 | Chen et al. |
| 2011/0281532 A1 | 11/2011 | Shin et al. |
| 2011/0299438 A1 | 12/2011 | Mikhemar |
| 2011/0306310 A1 | 12/2011 | Bai |
| 2012/0051409 A1 | 3/2012 | Brobston et al. |
| 2012/0062431 A1 | 3/2012 | Tikka et al. |
| 2012/0075159 A1 | 3/2012 | Chang |
| 2012/0084537 A1 | 4/2012 | Indukuru et al. |
| 2012/0094708 A1 | 4/2012 | Park |
| 2012/0100802 A1 | 4/2012 | Mohebbi |
| 2012/0112851 A1 | 5/2012 | Manssen |
| 2012/0112852 A1 | 5/2012 | Manssen et al. |
| 2012/0119843 A1 | 5/2012 | du Toit et al. |
| 2012/0119844 A1 | 5/2012 | du Toit et al. |
| 2012/0154975 A1 | 6/2012 | Oakes |
| 2012/0214421 A1 | 8/2012 | Hoirup |
| 2012/0220243 A1 | 8/2012 | Mendolia |
| 2012/0243579 A1 | 9/2012 | Premakanthan et al. |
| 2012/0286586 A1 | 11/2012 | Balm |
| 2012/0293384 A1 | 11/2012 | Knudsen et al. |
| 2012/0295554 A1 | 11/2012 | Greene et al. |
| 2012/0295555 A1 | 11/2012 | Greene et al. |
| 2013/0005277 A1 | 1/2013 | Klomsdorf et al. |
| 2013/0052967 A1 | 2/2013 | Black et al. |
| 2013/0056841 A1 | 3/2013 | Hsieh et al. |
| 2013/0106332 A1 | 5/2013 | Williams et al. |
| 2013/0122829 A1 | 5/2013 | Hyvonen et al. |
| 2013/0137384 A1 | 5/2013 | Desclos et al. |
| 2013/0154897 A1 | 6/2013 | Sorensen et al. |
| 2013/0215846 A1 | 8/2013 | Yerrabommanahalli et al. |
| 2013/0315285 A1 | 11/2013 | Black et al. |
| 2014/0002323 A1 | 1/2014 | Ali et al. |

FOREIGN PATENT DOCUMENTS

| | | |
|---|---|---|
| DE | 102008050743 | 4/2010 |
| DE | 102009018648 A1 | 10/2010 |
| EP | 0685936 | 6/1995 |
| EP | 0909024 | 4/1999 |
| EP | 1079296 | 2/2001 |
| EP | 1137192 | 9/2001 |

(56) References Cited

FOREIGN PATENT DOCUMENTS

| | | |
|---|---|---|
| EP | 1298810 | 4/2006 |
| EP | 2328233 | 6/2011 |
| EP | 2388925 A1 | 11/2011 |
| EP | 2424119 A1 | 2/2012 |
| JP | 03276901 | 3/1990 |
| JP | 02-077580 | 9/1991 |
| JP | 9321526 | 12/1997 |
| JP | 10209722 | 8/1998 |
| JP | 2000124066 | 4/2000 |
| JP | 2005-130441 | 5/2005 |
| KR | 100645526 | 11/2006 |
| KR | 10-0740177 | 7/2007 |
| WO | 01/71846 | 9/2001 |
| WO | 2006/031170 | 3/2006 |
| WO | 2008/030165 | 3/2008 |
| WO | 2009/064968 | 5/2009 |
| WO | 2009108391 A1 | 9/2009 |
| WO | 2009/155966 | 12/2009 |
| WO | 2010121914 A1 | 10/2010 |
| WO | 2011/044592 | 4/2011 |
| WO | 2011/084716 | 7/2011 |
| WO | 2011/133657 | 10/2011 |
| WO | 2011028453 | 10/2011 |
| WO | 2012/067622 | 5/2012 |
| WO | 2012/085932 | 6/2012 |

OTHER PUBLICATIONS

Bezooijen, A. et al., "A GSM/EDGE/WCDMA Adaptive Series-LC Matching Network Using RF-MEMS Switches", IEEE Journal of Solid-State Circuits, vol. 43, No. 10, Oct. 2008, 2259-2268.

Eiji, N., "High-Frequency Circuit and Its Manufacture", Patent Abstracts of Japan, vol. 1998, No. 13, Nov. 30, 1998 & JP 10 209722 A (Seiko Epson Corp), Aug. 7, 1998.

Huang, Libo et al., "Theoretical and experimental investigation of adaptive antenna impedance matching for multiband mobile phone applications", IEEE, Sep. 7, 2005, 13-17.

Hyun, S., "Effects of strain on the dielectric properties of tunable dielectric SrTiO3 thin films", Applied Physics Letters, vol. 79, No. 2, Jul. 9, 2001.

Ida, I. et al., "An Adaptive Impedence Matching System and Its Application to Mobile Antennas", TENCON 2004, IEEE Region 10 Conference, See Abstract ad p. 544, Nov. 21-24, 2004, 543-547.

Katsuya, K., "Hybrid Integrated Circuit Device", Patent Abstracts of Japan, Publication number: 03-276901, Date of publication of application: Sep. 12, 1991.

Manssen, "Method and Apparatus for Managing Interference in a Communication Device", U.S. Appl. No. 61/326,206, filed Apr. 20, 2010.

Paratek Microwave, Inc., "Method and Appartus for Tuning Antennas in a Communication Device", International Application No. PCT/US11/59620; Filed Nov. 7, 2011.

Patent Cooperation Treaty, "International Search Report and Written Opinion", International Application No. PCT/US2010/046241, Mar. 2, 2011.

Patent Cooperation Treaty, "International Search Report and Written Opinion", International Application No. PCT/US2010/056413, Jul. 27, 2011.

Patent Cooperation Treaty, "International Search Report and Written Opinion", Nov. 16, 2011, International Application No. PCT/US/2011/038543.

Patent Cooperation Treaty, "International Search Report and Written Opinion", PCT Application No. PCT/US08/005085, Jul. 2, 2008.

Pervez, N.K., "High Tunability barium strontium titanate thin films for RF circuit applications", Applied Physics Letters, vol. 85, No. 19, Nov. 8, 2004.

Petit, Laurent, "MEMS-Switched Parasitic-Antenna Array for Radiation Pattern Diversity", IEEE Transactions on Antennas and Propagation, vol. 54, No. 9, Sep. 2009, 2624-2631.

Qiao, et al., "Antenna Impedance Mismatch Measurement and Correction for Adaptive COMA Transceivers", IEEE, Jan. 2005.

Qiao, et al., "Measurement of Antenna Load Impedance for Power Amplifiers", The Department of Electrical and Computer Engineering, University of California, San Diego, Sep. 13, 2004.

Stemmer, Susanne, "Low-loss tunable capacitors fabricated directly on gold bottom electrodes", Applied Physics Letters 88, 112905, Mar. 15, 2006.

Taylor, T.R. , "Impact of thermal strain on the dielectric constant of sputtered barium strontium titanate thin films", Applied Physics Letters, vol. 80, No. 11, Mar. 18, 2002.

Tombak, Ali, "Tunable Barium Strontium Titanate Thin Film Capacitors For RF and Microwave Applications", IEEE Microwave and Wireles Components Letters, vol. 12, Jan. 2002.

Xu, Hongtao, "Tunable Microwave Integrated Circuits using BST Thin Film Capacitors with Device", Integrated Ferroelectrics, Department of Electrical Engineering and Computer Engineering, University of California, 2005, Apr. 2005.

Zuo, S., "Eigenmode Decoupling for Mimo Loop-Antenna Based on 180 Coupler", Progress in Electromagnetics Research Letters, vol. 26, Aug. 2011, 11-20.

\* cited by examiner

700

LOOK-UP TABLE

| |
|---|
| Band 1; Use Case 1; Desired tuning state |
| Band 1; Use Case 2; Desired tuning state |
| ⋮ |
| Band 1; Use Case n; Desired tuning state |
| Band 2; Use Case 1; Desired tuning state |
| Band 2; Use Case 2; Desired tuning state |
| ⋮ |
| Band 2; Use Case n; Desired tuning state |
| Band N; Use Case 1; Desired tuning state |
| Band N; Use Case 2; Desired tuning state |
| ⋮ |
| Band N; Use Case n; Desired tuning state |

FIG. 9

METHOD AND APPARATUS FOR RADIO ANTENNA FREQUENCY TUNING

CROSS-REFERENCE TO RELATED APPLICATIONS

This application is a continuation of U.S. patent application Ser. No. 13/030,177, filed Feb. 18, 2011, which is incorporated herein by reference in its entirety.

FIELD OF THE DISCLOSURE

The present disclosure relates to a method and apparatus for radio antenna frequency tuning and in particular determining tuning states in a communication device.

BACKGROUND

Existing multi-frequency wireless devices (e.g., radios) use an antenna structure that attempts to radiate at optimum efficiency over the entire frequency range of operation, but can really only do so over a subset of the frequencies. Due to size constraints, and aesthetic design reasons, the antenna designer is forced to compromise the performance in some of the frequency bands. An example of such a wireless device could be a mobile telephone that operates over a range of different frequencies, such as 800 MHz to 2200 MHz. The antenna will not radiate efficiently at all frequencies due to the nature of the design, and the power transfer between the antenna, the power amplifier, and the receiver in the radio will vary significantly.

Additionally, an antenna's performance is impacted by its operating environment. For example, multiple use cases exist for radio handsets, which include such conditions as the placement of the handset's antenna next to a user's head, or in the user's pocket or the covering of an antenna with a hand, all of which can significantly impair the wireless device antenna's radiated efficiency.

Further, many existing radios use a simple circuit composed of fixed value components that are aimed at improving the power transfer from power amplifier to antenna, or from the antenna to the receiver, but since the components used are fixed in value there is always a compromise when attempting to cover multiple frequency bands and multiple use cases.

BRIEF DESCRIPTION OF THE DRAWINGS

FIG. 9 depicts an illustrative embodiment of a look-up table utilized by the communication device of FIG. 1.

DETAILED DESCRIPTION

Figure 1:
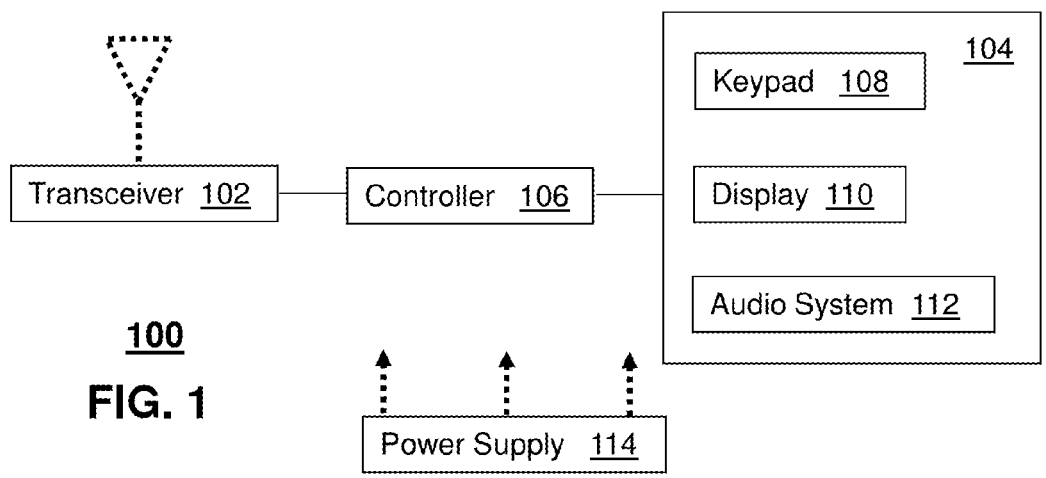
FIG. 1 depicts an illustrative embodiment of a communication device.

The present disclosure provides a method and apparatus for radio antenna frequency tuning. One or more exemplary embodiments can employ an open loop mechanism to solve the fundamental problems associated with antenna performance over a range of frequencies and use cases.

One or more exemplary embodiments can address applying tuning to changing antenna environments without the need for, or use of, a direct feedback loop from the antenna. However, other embodiments can utilized a combination of open loop and closed loop feedback.

One embodiment of the present disclosure entails a method to select a tuning state of a tunable matching network operable in a communication device, where the tunable matching network has a tunable reactance that affects one or more performance parameters of the communication device. The method can include performing the selection of the tuning state based on radio frequency and incomplete information about the antenna environment without direct feedback on the performance from the antenna, and identifying the tuning state resulting in the most desirable performance of the communications device.

In one embodiment, a method is provided that includes obtaining a usage condition associated with operation of a wireless communication device where the usage condition is obtained by a processor of the wireless communication device, selecting a subset of use cases from a group of use cases based on the usage condition, obtaining an operational parameter associated with a transceiver of the wireless communication device where the operational parameter is measured during the operation of the wireless communication device, and selecting a target use case from among the subset of use cases based on the operational parameter.

In another embodiment, a non-transitory computer-readable storage medium is provided that includes computer instructions to determine a subset of use cases from a group of use cases stored in a memory of a communication device and to determine a target use case from among the subset of use cases based on an operational parameter associated with a transceiver of the communication device.

In another embodiment, a matching network for a communication device can include an impedance matching circuit connectable with an antenna of the communication device, where the impedance matching circuit comprises one or more variable components. The matching network can also include a controller connectable with the impedance matching circuit. The controller can be configured to select a subset of use cases from a group of use cases based on a usage condition of the communication device, obtain an operational parameter associated with a transceiver of the communication device where the operational parameter is obtained during the operation of the communication device, select a target use case from among the subset of use cases based on the operational parameter, and adjust the one or more variable components based on the determined target use case to tune the impedance matching circuit.

In one embodiment, a look-up table can be utilized that maps possible use case positions to tuning states for the tunable matching network. Each of the possible use cases can be accommodated by a tuning state which attempts to provide a match for whatever performance attributes were selected by the product designer. In some instances, a particular use case can be completely identified by a set of detectable or otherwise known conditions that can be used to point to the correct or desired tuning state in the look up table. In other instances, the conditions (e.g., slider position, speaker activity, and so forth) can only narrow the possible number of use cases down to a subset of possible use cases in the look-up table. In these instances, the method of the present disclosure can be used to identify which of the tuning states can tune the adjustable matching network to achieve the desired performance of the communication device.

In one embodiment, after the appropriate tuning state is identified, the adjustable matching network is tuned to that state until the processor detects changes in the conditions or inputs that may indicate that the use case or the network channel number (e.g., operating frequency) has changed. Those inputs which can indicate a possible change in use case include, but are not limited to, received signal strength indicator (RSSI) or other operational parameters failing to satisfy a threshold. In one embodiment, the inputs can include the handset transmit power being increased by a certain number of power steps or dBs. Both of these inputs or conditions can indicate a possible change in the use case, but other inputs within the handset can also be utilized by the exemplary embodiments to indicate a possible change.

In another embodiment, a receiver parametric measurement, such as the RSSI, can be used as an indicator of which tuning state creates a better matching condition for the current usage case. It should be understood by one of ordinary skill in the art that other measurements, including other receiver based measurements, can be used to make this determination, such as bit error rate. It should be further understood that a plurality of measurements can be utilized in selecting a use case from among the possible subset of use cases.

FIG. 1 depicts an exemplary embodiment of a communication device 100. The communication device 100 can comprise a wireless transceiver 102, a user interface (UI) 104, a power supply 114, and a controller 106 for managing operations thereof. In one embodiment, the transceiver 102 can have independent transmitter and receiver portions. The wireless transceiver 102 can utilize short-range and/or long-range wireless access technologies such as Bluetooth, WiFi, Digital Enhanced Cordless Telecommunications (DECT), or cellular communication technologies, just to mention a few. Cellular technologies can include, for example, CDMA-1X, WCDMA, UMTS/HSDPA, GSM/GPRS, TDMA/EDGE, EV/DO, WiMAX, and next generation cellular wireless communication technologies as they arise.

The UI 104 can include a depressible or touch-sensitive keypad 108 with a navigation mechanism such as a roller ball, joystick, mouse, or navigation disk for manipulating operations of the communication device 100. The keypad 108 can be an integral part of a housing assembly of the communication device 100 or an independent device operably coupled thereto by a tethered wireline interface (such as a flex cable) or a wireless interface supporting for example Bluetooth. The keypad 108 can represent a numeric dialing keypad commonly used by phones, and/or a Qwerty keypad with alphanumeric keys. The UI 104 can further include a display 110 such as monochrome or color LCD (Liquid Crystal Display), OLED (Organic Light Emitting Diode) or other suitable display technology for conveying images to an end user of the communication device 100. In an embodiment where the display 110 is a touch-sensitive display, a portion or all of the keypad 108 can be presented by way of the display.

The power supply 114 can utilize common power management technologies (such as replaceable batteries, supply regulation technologies, and charging system technologies) for supplying energy to the components of the communication device 100 to facilitate portable applications. The controller 106 can utilize computing technologies such as a microprocessor and/or digital signal processor (DSP) with associated storage memory such a Flash, ROM, RAM, SRAM, DRAM or other like technologies.

Figure 2:
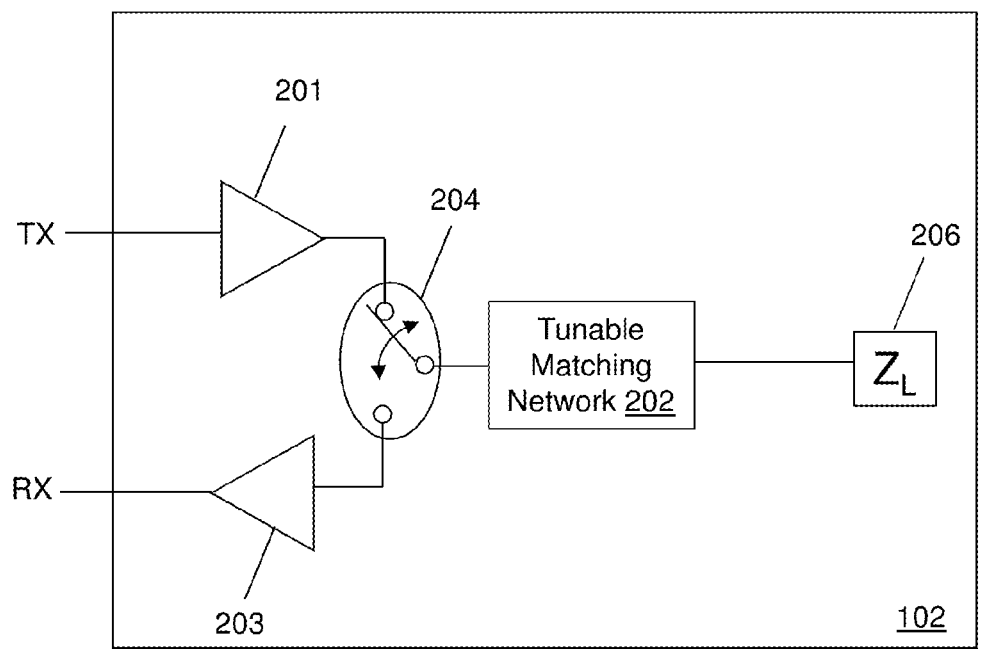
FIG. 2 depicts an illustrative embodiment of a portion of a transceiver of the communication device of FIG. 1.

FIG. 2 depicts an illustrative embodiment of a portion of the wireless transceiver 102 of the communication device 100 of FIG. 1. In one embodiment, such as for GSM applications, the transmit and receive portions of the transceiver 102 can include amplifiers 201, 203 coupled to a tunable matching network 202 and an impedance load 206 by way of a switch 204. The load 206 in the present illustration can include an antenna as shown in FIG. 1 (herein antenna 206). A transmit signal in the form of a radio frequency (RF) signal (TX) can be directed to the amplifier 201 which amplifies the signal and directs the amplified signal to the antenna 206 by way of the tunable matching network 202 when switch 204 is enabled for a transmission session. The receive portion of the transceiver 102 can utilize a pre-amplifier 203 which amplifies signals received from the antenna 206 by way of the tunable matching network 202 when switch 204 is enabled for a receive session. Other configurations of FIG. 2 are possible for other types of cellular access technologies, such as CDMA. These undisclosed configurations are contemplated by the present disclosure.

Figure 3:
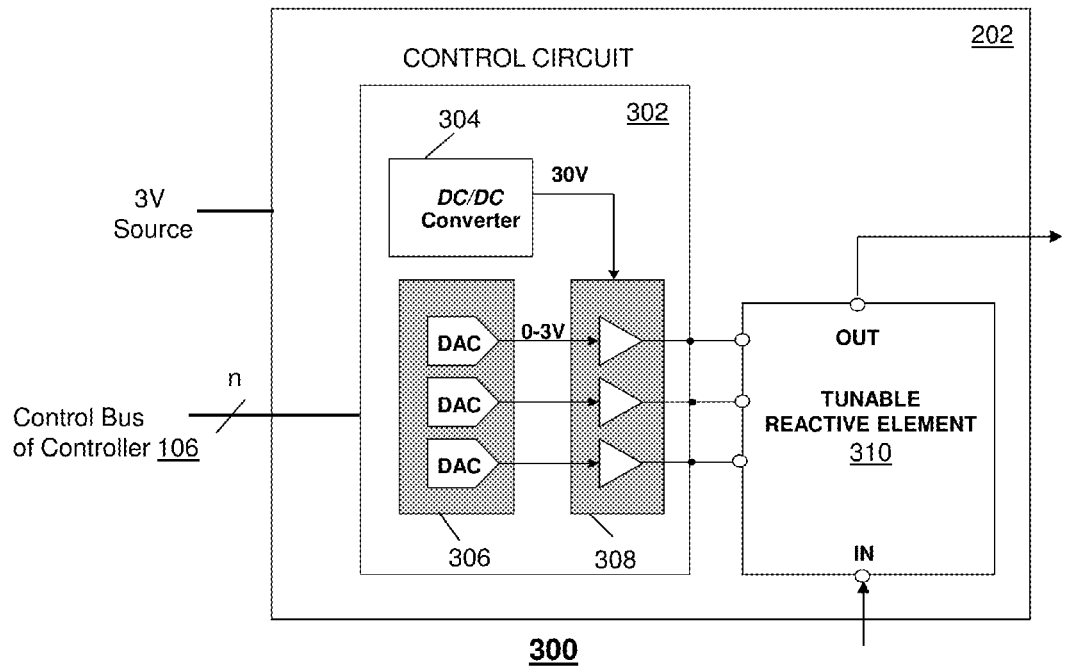
FIGS. 3-4 depict illustrative embodiments of a tunable matching network of the transceiver of FIG. 2.
Figure 4:
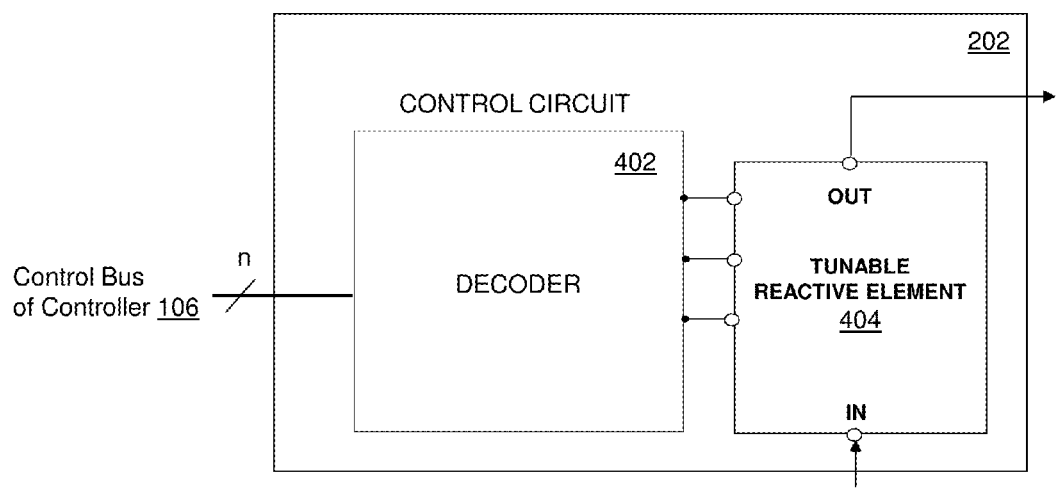
Figure 5:
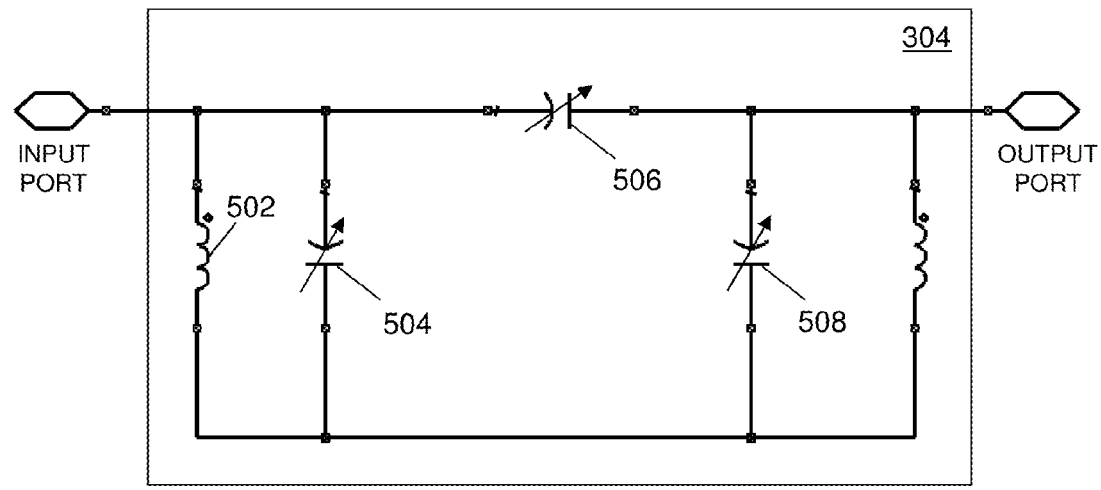
FIGS. 5-6 depict illustrative embodiments of a tunable reactive element of the tunable matching network.

FIGS. 3-4 depict illustrative embodiments of the tunable matching network 202 of the transceiver 102 of FIG. 2. In one embodiment, the tunable matching network 202 can comprise a control circuit 302 and a tunable reactive element 310. The control circuit 302 can comprise a DC-to-DC converter 304, one or more digital to analog converters (DACs) 306 and one or more corresponding buffers 308 to amplify the voltage generated by each DAC. The amplified signal can be fed to one or more tunable reactive components 504, 506 and 508 such as shown in FIG. 5, which depicts a possible circuit configuration for the tunable reactive element 310. In this illustration, the tunable reactive element 310 includes three tunable capacitors 504, 506, 508 and an inductor 502 with a fixed inductance. Other circuit configurations are possible, including use of other components, and are thereby contemplated by the present disclosure.

The tunable capacitors 504, 506, 508 can each utilize technology that enables tunability of the capacitance of said component. One embodiment of the tunable capacitors 504, 506, 508 can utilize voltage or current tunable dielectric materials such as a composition of barium strontium titanate (BST). An illustration of a BST composition is the Parascan® Tunable Capacitor. In another embodiment, the tunable reactive element 310 can utilize semiconductor varactors. Other present or next generation methods or material compositions that can support a means for a voltage or current tunable reactive element are contemplated by the present disclosure.

The DC-to-DC converter 304 can receive a power signal such as 3 Volts from the power supply 114 of the communication device 100 in FIG. 1. The DC-to-DC converter 304 can use common technology to amplify this power signal to a higher range (e.g., 30 Volts) such as shown. The controller 106 can supply digital signals to each of the DACs 306 by way of a control bus of "n" or more wires to individually control the capacitance of tunable capacitors 504, 506, 508, thereby varying the collective reactance of the tunable matching network 202. The control bus can be implemented with a two-wire common serial communications technology such as a Serial Peripheral Interface (SPI) bus. With an SPI bus, the controller 106 can submit serialized digital signals to configure each DAC in FIG. 3 or the switches of the tunable reactive element 404 of FIG. 4. The control circuit 302 of FIG. 3 can utilize common digital logic to implement the SPI bus and to direct digital signals supplied by the controller 106 to the DACs.

Figure 6:
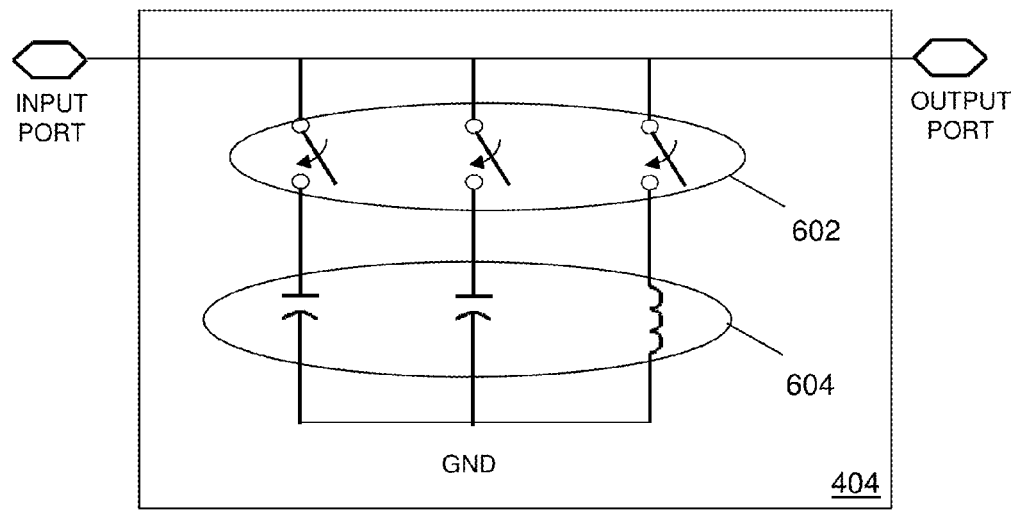

In another embodiment, the tunable matching network 202 can comprise a control circuit 402 in the form of a decoder and a tunable reactive element 404 comprising switchable reactive elements such as shown in FIGS. 4 and 6. In this embodiment, the controller 106 can supply the control circuit 402 signals via the SPI bus which can be decoded with Boolean or state machine logic to individually enable or disable the switching elements 602. The switching elements 602 can be implemented using various types of switches, such as semiconductor switches or micro-machined switches including those utilized in micro-electromechanical systems (MEMS). By independently enabling and disabling the reactive elements (capacitor or inductor) of FIG. 6 with the switching elements 602, the collective reactance of the tunable reactive element 404 can be varied.

The tunability of the tunable matching networks 202, 204 provides the controller 106 a means to optimize performance parameters of the transceiver 102 such as, for example, but not limited to, transmitter power, transmitter efficiency, receiver sensitivity, power consumption of the communication device, a specific absorption rate (SAR) of energy by a human body, frequency band performance parameters, and so forth. To achieve one or more desirable performance characteristics which can be defined, the communication device 100 can utilize a tuning state selection method, such as depicted in FIG. 8.

Figure 7:
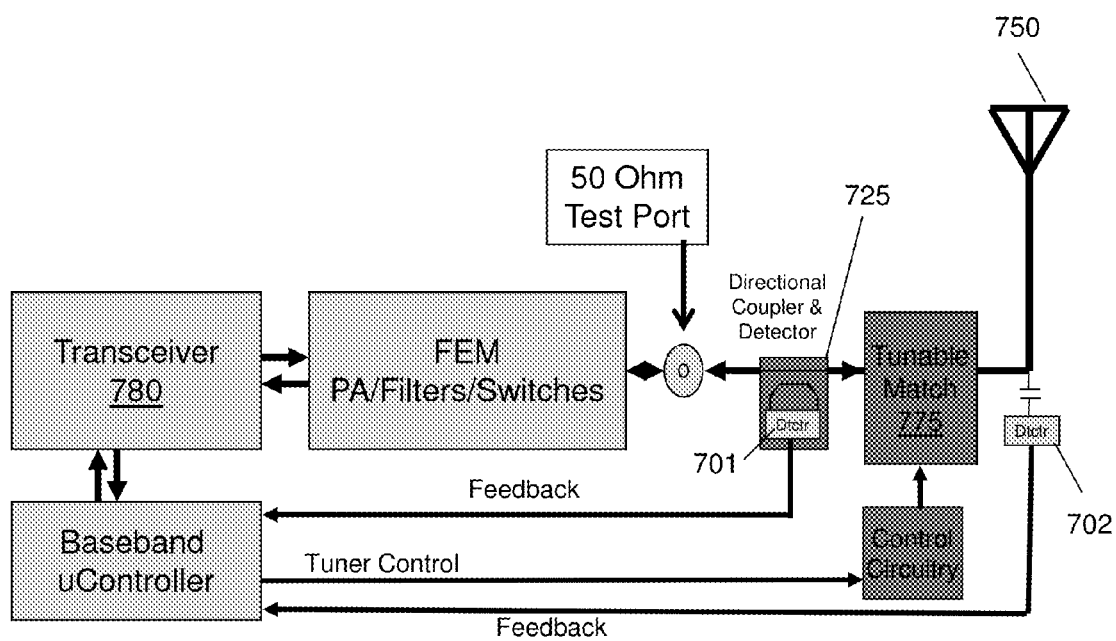
FIG. 7 depicts an illustrative embodiment of a portion of another communication device.

FIG. 7 depicts an exemplary embodiment of a portion of a communication device 700 (such as device 100 in FIG. 1) having a tunable matching network which can include, or otherwise be coupled with, a number of components such as a directional coupler, a sensor IC, control circuitry and/or a tuner. The tunable matching network can include various other components in addition to, or in place of, the components shown, including components described above with respect to FIGS. 1-6. In addition to the detector 701 coupled to the directional coupler 725, there is shown a detector 702 coupled to the RF line feeding the antenna 750. A tunable matching network 775 can be coupled to the antenna 750 and a transceiver 780 (or transmitter and/or receiver) for facilitating communication of signals between the communication device 700 and another device or system. In this exemplary embodiment, the tunable match can be adjusted using all or a portion of the detectors for feedback to the tuning algorithm.

Figure 8:
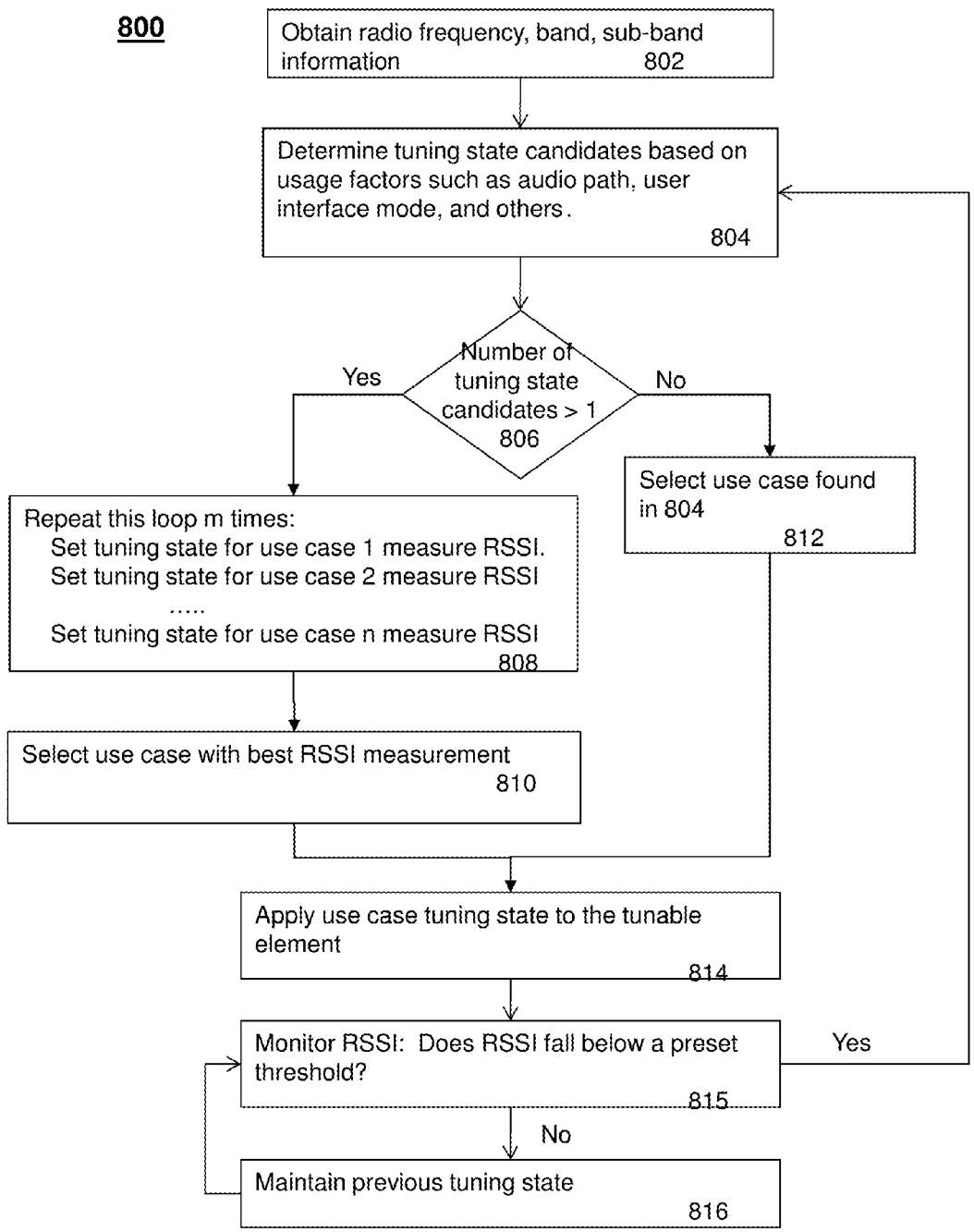
FIG. 8 depicts an exemplary method operating in the communication device in FIG. 1.

In addition to the algorithm described with respect to FIG. 8, other algorithms can be utilized for tuning of the antenna 750, such as disclosed in U.S. patent application Ser. No. 12/941,972 filed on Nov. 8, 2010 by Manssen et al., the disclosure of which is hereby incorporated by reference herein. Other algorithms that can be used with the exemplary embodiments described herein are disclosed in U.S. Patent Application Publication 2009/0121963 filed on Nov. 14, 2007 by Greene, the disclosure of which is hereby incorporated by reference herein. The Greene Application describes several methods utilizing Figures of Merit, which in this exemplary embodiment can be determined in whole or in part from measurements of the forward and reverse signals present at detector 701. This exemplary embodiment, can also utilize detector 702 to further improve the ability of the tuning system to enable improved performance of the communication device. One embodiment of the algorithm can utilize the inputs from detector 701 to establish a maximum return loss or VSWR for the matching network. This method can establish a range of impedances around the targeted impedance. This range of impedances may establish an acceptable level of performance. Input from detector 702 can then be utilized to allow the algorithm to find an improved or best impedance within that acceptable range. For instance, the algorithm could continue to modify the matching network 775 in order to increase the RF voltage detected at the antenna feed, while constraining the return loss (measured by detector 701) to stay within the target return loss. In this embodiment, communication device 700 can allow tuning for source impedances that are not 50 ohms. In this example, the lowest insertion loss can be chosen for the tuning algorithm.

In another embodiment, the tuning algorithm can maintain the return loss while minimizing the current drain to determine desired tuning values. The tuning algorithm can utilize various parameters for tuning the device, including output power of the transmitter, return loss, received power, current drain and/or transmitter linearity.

FIG. 8 depicts an embodiment of yet another algorithmic method 800 which can be used for selecting a desired tuning state, while also resolving any inaccuracy in determining a particular use case that affects the antenna environment and resulting antenna performance. In 802, the radio frequency and/or other RF information (e.g., band and sub-band) can be determined. One or more usage conditions or factors such as, for example, but not limited to, audio path configuration, user interface mode of operation, and radio bearer type, can be used at 804 to determine a number of tuning state candidates, which have the highest probability of matching the actual environment of the communication device.

In one embodiment, the tuning state candidates can be obtained from one or more look-up tables 900, such as shown in FIG. 9. In another embodiment, the look-up table 900 can be indexed (e.g., by the controller 106 of the communication device 100 of FIG. 1) during operation according to band and/or use case. The look-up table 900 can be static and/or dynamic. For example, the look-up table 900 can be pre-loaded into the memory of the communication device 100 based on known or estimated use cases, usage conditions or factors, and so forth. In another example, the look-up table 900 can be populated or adjusted based on values determined during operation of the communication device 100. The tuning state candidates can be a subset of use cases that are selected from a group of use cases stored in a memory of the communication device, such as in table 900.

Method 800 can employ a threshold to remove the most unlikely tuning state candidates from consideration. When more than one tuning state candidate has been found at 806, method 800 can resolve which candidate provides the desirable or best match at 808 by examining parameters such as those that are readily available in the wireless device. As an example, but not being limited thereto, method 800 can utilize RSSI, Received Signal Code Power (RSCP), Received Signal Quality (RXQUAL), Received Bit Error Rate, current drain, transmit power control level, and so forth as parameters to select a tuning state from among the subset of tuning states that were identified at 804. One of these or other parameters can be utilized alone in selecting from among the subset of identified tuning states or a combination of parameters can be utilized by method 800 for performing the tuning state selection. In addition, feedback from the cellular base station can be utilized. For instance, if the handset is directed to transmit at a lower power step with one tuning state than another, that information could be utilized to determine which tuning state provides a better match for the handset transmitter. Other parameters can also be utilized for performing the tuning state selection from among the subset of tuning states, including parameters identified in various communication device standards. In another embodiment, the directional coupler of FIG. 7 can be utilized for obtaining the operational parameter that is used with method 800.

Method 800 can set the tuning state and sample the parameter(s) resulting from that tuning state change. In one embodiment, at least one sample for each tuning state setting can be utilized. More samples may also be utilized in which case the sample order can be interleaved as shown in step 808 where the n different possible tuning states can be set and RSSI or other parameter(s) measured for each, with each of the n states repeated m times. The resultant m measurements for each state can be then be averaged or otherwise processed in order to determine which tuning state will be chosen as the preferred state. When samples have been collected they are evaluated at 810 and the use case from among the identified subset of use cases that best matches the desired performance goal is selected, such as, for example, but not limited to, the best RSSI measurement. As described above, use of RSSI is an example and one or more other parameters can be used in place of, or in combination with, the RSSI parameter.

If the number of tuning state candidates or use cases selected at 804 is only one then at 812 the method 800 can select and use that one use case. The method 800 then applies the selected tuning state to the tunable element 814.

Method 800 can enter a loop at 815 which monitors RSSI or the one or more other parameters utilized, and compares measurements (or averaged measurements) to a preset threshold associated with the parameter(s). If the monitored level drops below, or otherwise no longer satisfies the threshold, then the method 800 can return to 804 to determine the tuning state candidate(s). If the threshold is satisfied, then the method 800 can maintain the previous tuning state at 816 and returns to 815. In another embodiment, method 800 can monitor other parameters at 815 which are different from the parameter(s) used at 808, 810 to select the best or desirable use case among the subset of identified use cases. For example, the parameter(s) used to select among the identified use cases can be different from the parameter(s) used to determine whether method 800 needs to again determine tuning state candidates back at 804.

Figure 10:
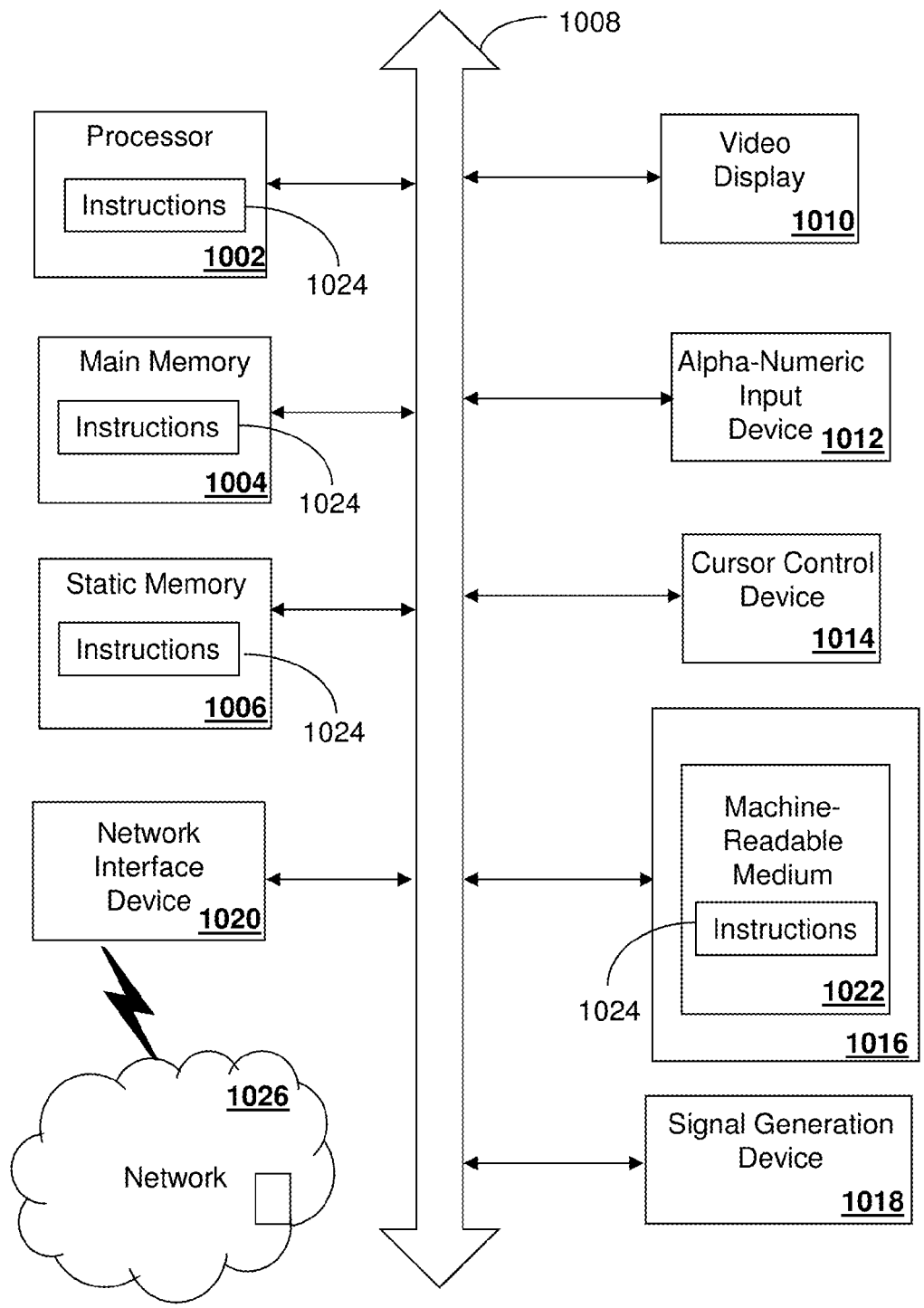
FIG. 10 depicts an exemplary diagrammatic representation of a machine in the form of a computer system within which a set of instructions, when executed, may cause the machine to perform any one or more of the methodologies disclosed herein.

FIG. 10 depicts an exemplary diagrammatic representation of a machine in the form of a computer system 1000 within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. It will be understood that a device of the present disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methodologies discussed herein.

The computer system 1000 may include a processor 1002 (e.g., a central processing unit (CPU), a graphics processing unit (GPU, or both), a main memory 1004 and a static memory 1006, which communicate with each other via a bus 1008. The computer system 1000 may further include a video display unit 1010 (e.g., a liquid crystal display (LCD), a flat panel, a solid state display, or a cathode ray tube (CRT)). The computer system 1000 may include an input device 1012 (e.g., a keyboard), a cursor control device 1014 (e.g., a mouse), a disk drive unit 1016, a signal generation device 1018 (e.g., a speaker or remote control) and a network interface device 1020.

The disk drive unit 1016 may include a machine-readable medium 1022 on which is stored one or more sets of instructions (e.g., software 1024) embodying any one or more of the methodologies or functions described herein, including those methods illustrated above. The instructions 1024 may also reside, completely or at least partially, within the main memory 1004, the static memory 1006, and/or within the processor 1002 during execution thereof by the computer system 1000. The main memory 1004 and the processor 1002 also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions 1024, or that which receives and executes instructions 1024 from a propagated signal so that a device connected to a network environment 1026 can send or receive voice, video or data, and to communicate over the network 1026 using the instructions 1024. The instructions 1024 may further be transmitted or received over a network 1026 via the network interface device 1020.

While the machine-readable medium 1022 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and/or a digital file attachment to e-mail or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same functions are considered equivalents.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method comprising:
   receiving, by a system of a wireless communication device, tuning information from a base station, the wireless communication device including an impedance matching circuit;
   determining, by the system, a usage condition associated with operation of the wireless communication device;
   identifying, by the system, a subset of use cases from a group of use cases based on the usage condition;
   determining, by the system, an operational parameter associated with a transceiver of the wireless communication device, the operational parameter being determined via parametric measurements for each tuning state corresponding to each of the subset of use cases during the operation of the wireless communication device, wherein the parametric measurements are obtained at each of the tuning states at different times during an ordered sequence of sampling and wherein the operational parameter is determined based on averaging the parametric measurements to identify an average operational parameter for each tuning state; and
   selecting, by the system, a target use case from among the subset of use cases based on the operational parameter and the tuning information received from the base station.

2. The method of claim 1, comprising adjusting, by the system, a variable reactance component based on the target use case to tune the impedance matching circuit of the wireless communication device.

3. The method of claim 2, wherein the adjusting of the variable reactance component comprises adjusting a variable capacitance element of the impedance matching circuit.

4. The method of claim 1, wherein the selecting of the target use case from among the subset of use cases is based on an averaging of select ones of the parametric measurements.

5. The method of claim 1, wherein the operational parameter is not an operational mode of the wireless communication device and is not a wireless protocol.

6. The method of claim 5, comprising:
   determining, by the system, a second operational parameter associated with the transceiver, the second operational parameter being determined from second parametric measurements collected during the operation of the wireless communication device, wherein the second operational parameter is not the operational mode of the wireless communication device and is not the wireless protocol;
   comparing, by the system, the second operational parameter to a threshold; and
   selecting, by the system, a second subset of use cases from the group of use cases responsive to a determination that the second operational parameter does not satisfy the threshold,
   wherein the operational parameter is different from the second operational parameter.

7. The method of claim 1, wherein the operational parameter is associated with a receive portion of the transceiver and is obtained during a receive mode of the wireless communication device.

8. The method of claim 1, wherein the operational parameter comprises at least one of a received signal strength indicator, a received signal code power, a transmit power control level, a received signal quality, current drain, or a received bit error rate.

9. The method of claim 1, wherein the usage condition comprises at least one of a mechanical configuration of the wireless communication device or a user interface mode of the wireless communication device.

10. The method of claim 1, comprising:
    obtaining band information associated with the operation of the wireless communication device;
    storing the group of use cases in a table in a memory of the wireless communication device, wherein the selecting of the subset of use cases from the group of use cases stored in the table is based on the usage condition, the tuning information and the band information.

11. The method of claim 1, comprising adjusting, by the system, a variable reactance component based on the target use case to tune an impedance matching circuit of the wireless communication device, wherein the adjusting of the variable reactance component comprises adjusting one of a micro-electro-mechanical systems (MEMS) switch, a mechanical switch, or a semiconductor switch.

12. A communication device comprising:
a transceiver;
an impedance matching circuit coupled with the transceiver;
a memory to store computer instructions; and
a processor coupled with the memory and the impedance matching circuit, wherein the processor, responsive to executing the computer instructions, performs operations comprising:
receiving tuning information from a base station;
determining a usage condition associated with operation of the communication device;
identifying a subset of use cases from a group of use cases based on the usage condition;
determining an operational parameter associated with a transceiver of the communication device, the operational parameter being determined via parametric measurements for each tuning state corresponding to each of the subset of use cases during the operation of the communication device, wherein the parametric measurements are obtained at each of the tuning states at different times during an ordered sequence of sampling and wherein the operational parameter is determined based on averaging the parametric measurements to identify an average operational parameter for each tuning state; and
selecting a target use case from among the subset of use cases based on the operational parameter and the tuning information received from the base station.

13. The communication device of claim 12, wherein the tuning information includes different power parameters associated with different tuning states.

14. The communication device of claim 12, wherein the selecting of the target use case comprises determining the target use case from among the subset of use cases based on a determination as to which of the average operational parameters correlates with a desired performance goal.

15. The communication device of claim 12, wherein the impedance matching comprises a variable reactance component, and wherein the operations further comprise adjusting the variable reactance component based on the target use case to tune the impedance matching circuit.

16. The communication device of claim 12, wherein the operational parameter comprises a received signal strength indicator, and wherein the usage condition comprises a radio bearer type.

17. The communication device of claim 12, wherein the operational parameter is associated with a receive portion of a transceiver and is obtained during a receive mode of the communication device.

18. A non-transitory computer-readable storage device comprising computer instructions which, responsive to being executed by a processor of a communication device, cause the processor to perform operations comprising:
selecting a subset of use cases from a group of use cases based on a usage condition of the communication device;
collecting parametric measurements associated with a transceiver of the communication device for each tuning state corresponding to each of the subset of use cases during the operation of the communication device, wherein the collecting of the parametric measurements comprises collecting multiple parametric measurements for each tuning state corresponding to each of the subset of use cases during the operation of the communication device;
selecting a target use case from among the subset of use cases based on the parametric measurements, wherein the selecting of the target use case from among the subset of use cases is based on an averaging of select ones of the multiple parametric measurements;
receiving tuning information from a base station; and
tuning an impedance matching circuit of the communication device by adjusting a variable reactance component based on the target use case and based on the tuning information received from the base station.

19. The non-transitory computer-readable storage device of claim 18, wherein the tuning information includes different power parameters associated with different tuning states wherein the selecting of the target use case from among the subset of use cases is based on an averaging of select ones of the multiple parametric measurements.

20. The non-transitory computer-readable storage device of claim 18, wherein the parametric measurements are associated with a receive portion of the transceiver and are obtained during a receive mode of the communication device.

* * * * *